(12) United States Patent
Li et al.

(10) Patent No.: US 10,818,864 B2
(45) Date of Patent: Oct. 27, 2020

(54) OLED DEVICE AND MANUFACTURING METHOD THEREOF, AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Xiping Li, Beijing (CN); Wen Sun, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

(*) Notice: Subject to any disclaimer, the term of this patent is extended or adjusted under 35 U.S.C. 154(b) by 0 days.

(21) Appl. No.: 16/050,283

(22) Filed: Jul. 31, 2018

(65) Prior Publication Data
US 2019/0058146 A1 Feb. 21, 2019

(30) Foreign Application Priority Data

Aug. 15, 2017 (CN) .......................... 2017 1 0696908

(51) Int. Cl.
*H01L 51/00* (2006.01)
*H01L 51/50* (2006.01)
(Continued)

(52) U.S. Cl.
CPC ...... *H01L 51/5088* (2013.01); *H01L 27/3211* (2013.01); *H01L 51/5004* (2013.01);
(Continued)

(58) Field of Classification Search
CPC ............. H01L 51/5088; H01L 27/3211; H01L 51/5004; H01L 51/5012; H01L 51/5056;
(Continued)

(56) References Cited

U.S. PATENT DOCUMENTS

| 2016/0372667 A1* | 12/2016 | Kugler | .................. H01L 51/006 |
| 2017/0222173 A1* | 8/2017 | Matsusue | ............ H01L 51/5044 |
| 2018/0033984 A1* | 2/2018 | Luchinger | ........... H01L 51/4246 |

FOREIGN PATENT DOCUMENTS

| JP | 2011216778 A | 10/2011 |
| JP | 2012156075 A | 8/2012 |

OTHER PUBLICATIONS

The Second Office Action dated May 21, 2019 corresponding to Chinese application No. 201710696908.4.

* cited by examiner

*Primary Examiner* — Kimberly N Rizkallah
*Assistant Examiner* — Alexander Belousov
(74) *Attorney, Agent, or Firm* — Nath, Goldberg & Meyer; Joshua B. Goldberg

(57) ABSTRACT

An OLED device, a manufacturing method of an OLED device and a display apparatus are provided. The OLED device includes a plurality of pixels, each of the plurality of pixels including a plurality of sub-pixels with different colors, each of the plurality of sub-pixels including a first electrode, a second electrode, and a light-emitting material layer disposed between the first electrode and the second electrode. A hole injection layer is disposed between the light-emitting material layer and the first electrode of each of the sub-pixels, and the number of layers of the hole injection layer between the light-emitting material layer and the first electrode of a part of the sub-pixels is lower than that of other sub-pixels.

17 Claims, 5 Drawing Sheets

(51) Int. Cl.
*H01L 27/32* (2006.01)
*H01L 51/52* (2006.01)
*H01L 51/56* (2006.01)

(52) U.S. Cl.
CPC ...... *H01L 51/5012* (2013.01); *H01L 51/5056* (2013.01); *H01L 51/5096* (2013.01); *H01L 51/5206* (2013.01); *H01L 51/5221* (2013.01); *H01L 51/5265* (2013.01); *H01L 51/56* (2013.01); *H01L 2251/308* (2013.01); *H01L 2251/552* (2013.01); *H01L 2251/558* (2013.01)

(58) Field of Classification Search
CPC ............ H01L 51/5096; H01L 51/5206; H01L 51/5221; H01L 51/56
See application file for complete search history.

OLED DEVICE AND MANUFACTURING METHOD THEREOF, AND DISPLAY APPARATUS

CROSS-REFERENCE TO RELATED APPLICATIONS

The present application claims the priority to the Chinese Patent Application No. 201710696908.4, filed on Aug. 15, 2017, in the Chinese Intellectual Property Office, the contents of which are incorporated herein in their entirety by reference.

TECHNICAL FIELD

The present disclosure relates to the field of OLED display technology, and in particular, relates to an OLED device and a manufacturing method thereof, and a display apparatus.

BACKGROUND

Generally, in an Organic Light Emitting Diode (OLED) display device, R, G, and B light-emitting pixels have the same device structure, and energies required by light-emitting materials in light-emitting material layers in the pixels of different colors to emit red, green, and blue light, have a quantitative relationship of $v_R < v_G < v_B$.

SUMMARY

The present disclosure provides an OLED device and a manufacturing method thereof, and a display apparatus.

The technical solution to solve a technical problem of the present disclosure is as follows.

The present disclosure provides an OLED device including a plurality of pixels, each of the plurality of pixels including a plurality of sub-pixels with different colors, each of the plurality of sub-pixels including a first electrode, a second electrode, and a light-emitting material layer disposed between the first electrode and the second electrode, wherein a hole injection layer is disposed between the light-emitting material layer and the first electrode of each of the sub-pixels, and the number of layers of the hole injection layer between the light-emitting material layer and the first electrode of a part of the sub-pixels is lower than that of other sub-pixels.

According to an embodiment of the present disclosure, the plurality of sub-pixels with different colors include a red sub-pixel, a green sub-pixel, and a blue sub-pixel, and the number of layers of the hole injection layer between the light-emitting material layer and the first electrode of the red sub-pixel is lower than those of the green sub-pixel and the blue sub-pixel.

According to an embodiment of the present disclosure, the first electrode is formed of an ITO material having a work function of about 4.7V.

An HOMO energy level represents a physical quantity of an organic layer, which refers to an orbit with the highest energy level occupied by an electron, called the highest occupied orbit.

According to an embodiment of the present disclosure, the OLED device further includes a hole transport layer between the light-emitting material layer and the hole injection layer, and the hole transport layer has an HOMO energy level of about 5.4V.

According to an embodiment of the present disclosure, the hole injection layer of the red sub-pixel is a single-layered hole injection layer composed of a first hole injection layer, and each of the hole injection layers of the green sub-pixel and the blue sub-pixel is a two-layered hole injection layer composed of the first hole injection layer and a second hole injection layer.

According to an embodiment of the present disclosure, the first hole injection layer and the second hole injection layer are formed of different materials, respectively, such that the first hole injection layer has an HOMO energy level lower than that of the second hole injection layer.

According to an embodiment of the present disclosure, the second hole injection layer has a thickness between about 5 nm and about 15 nm.

According to an embodiment of the present disclosure, the first hole injection layer of the red sub-pixel has a thickness between about 10 nm and about 25 nm, and the first hole injection layers of the green sub-pixel and the blue sub-pixel each have a thickness between about 5 nm and about 10 nm.

According to an embodiment of the present disclosure, the first hole injection layer has an HOMO energy level between about 4.9V and about 5.1V, and the second hole injection layer has an HOMO energy level between about 5.2V and about 5.3V.

According to an embodiment of the present disclosure, the hole injection layer of the red sub-pixel is a single-layered hole injection layer composed of a first hole injection layer, and each of the hole injection layers of the green sub-pixel and the blue sub-pixel is a three-layered hole injection layer composed of the first hole injection layer, a second hole injection layer and a third hole injection layer.

According to an embodiment of the present disclosure, the hole injection layer of the red sub-pixel is a single-layered hole injection layer composed of a first hole injection layer, the hole injection layer of the green sub-pixel is a two-layered hole injection layer composed of the first hole injection layer and a second hole injection layer, and the hole injection layer of the blue sub-pixel is a three-layered hole injection layer composed of the first hole injection layer, the second hole injection layer and a third hole injection layer According to an embodiment of the present disclosure, the first hole injection layer, the second hole injection layer, and the third hole injection layer are formed of different materials, respectively, such that HOMO energy levels of the first hole injection layer, the second hole injection layer, and the third hole injection layer are sequentially increased, and are higher than about 4.7V but lower than about 5.4V.

According to an embodiment of the present disclosure, the red sub-pixel, the green sub-pixel, and the blue sub-pixel have a same turn-on voltage.

According to an embodiment of the present disclosure, an electron blocking layer is further disposed in the light-emitting material layers of the red sub-pixel and the green sub-pixel, and an electron blocking layer is disposed between the light-emitting material layer and the hole transport layer of the blue sub-pixel.

The present disclosure further provides a manufacturing method of an OLED device including a plurality of pixels, each of the plurality of pixels including a plurality of sub-pixels with different colors, the method including steps of:

forming a first electrode;

forming a hole injection layer such that the number of layers of the hole injection layer between the light-emitting material layer and the first electrode of a part of the sub-pixels is lower than that of other sub-pixels;

forming a light-emitting material layer; and forming a second electrode.

According to an embodiment of the present disclosure, the plurality of sub-pixels with different colors include a red sub-pixel, a green sub-pixel, and a blue sub-pixel, and the step of forming a hole injection layer includes:

forming a first hole injection layer on each of the sub-pixels;

then only forming a further layer of material of the first hole injection layer on the red sub-pixel by blocking the green sub-pixel and the blue sub-pixel; and then only forming a second hole injection layer on the green sub-pixel and the blue sub-pixel by blocking the red sub-pixel.

According to an embodiment of the present disclosure, the plurality of sub-pixels with different colors include a red sub-pixel, a green sub-pixel, and a blue sub-pixel, and the forming a hole injection layer includes steps of:

forming a first hole injection layer on each of the sub-pixels;

then only forming a further layer of material of the first hole injection layer on the red sub-pixel by blocking the green sub-pixel and the blue sub-pixel; and then only forming a second hole injection layer and a third hole injection layer both on the green sub-pixel and the blue sub-pixel by blocking the red sub-pixel.

According to an embodiment of the present disclosure, the plurality of sub-pixels with different colors include a red sub-pixel, a green sub-pixel, and a blue sub-pixel, and the step of forming a hole injection layer includes steps of:

forming a first hole injection layer on each of the sub-pixels;

then only forming a further layer of material of the first hole injection layer on the red sub-pixel by blocking the green sub-pixel and the blue sub-pixel;

then only forming a second hole injection layer on the green sub-pixel and the blue sub-pixel by blocking the red sub-pixel;

then only forming a further layer of material of the second hole injection layer on the green sub-pixel by blocking the red sub-pixel and the blue sub-pixel; and then only forming a third hole injection layer on the blue sub-pixel by blocking the red sub-pixel and the green sub-pixel.

The present disclosure further provides a display apparatus, including the above OLED device.

DETAILED DESCRIPTION

In order to make those skilled in the art better understand the technical solution in the present disclosure, the specific implementations of the present disclosure will be described in detail below in conjunction with the drawings.

There exist some problems in the related art as follows. In a case where a red sub-pixel, a green sub-pixel, and a blue sub-pixel have the same structure, the turn-on voltages of the sub-pixels of different colors are different, generally $V_R<V_G<V_B$. This will cause a phenomenon of redness to appear in an OLED device when the OLED device is lighted at a lower gray scale, for example, when the voltage across the OLED device is lower than $V_G$. With the continuous development of OLED technology, the power consumption is required to be continuously reduced, that is, the absolute value of the voltage of the power supply is continuously reduced. This means that the voltage applied across the OLED device during emitting light is continuously reduced. At a lower gray scale, the voltage across the device is lower than the turn-on voltage of the green sub-pixel, which causes the phenomenon of redness to appear in the OLED device more easily.

Figure 1:
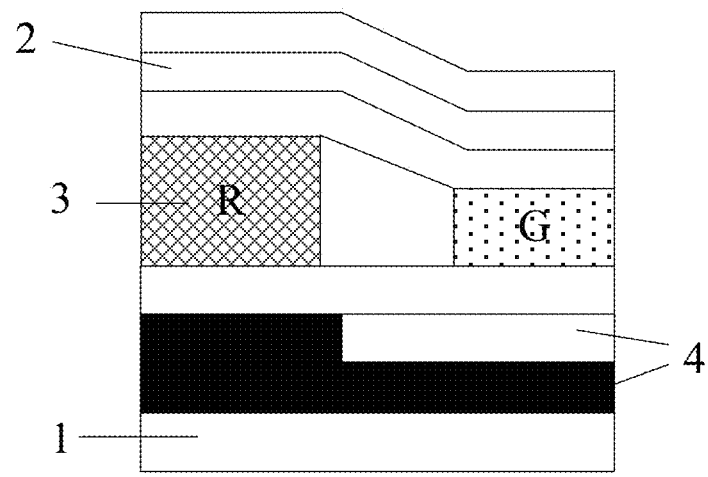
FIG. 1 is a schematic structural diagram of an OLED device according to an embodiment of the present disclosure.

As shown in FIG. 1, there is provided an OLED device including a plurality of pixels, each of the plurality of pixels including a plurality of sub-pixels with different colors, each of the plurality of sub-pixels including a first electrode 1, a second electrode 2, and a light-emitting material layer 3 disposed between the first electrode 1 and the second electrode 2. A hole injection layer 4 is disposed between the light-emitting material layer 3 and the first electrode 1 of each of the sub-pixels, and the number of layers included in the hole injection layer 4 between the light-emitting material layer 3 and the first electrode 1 of a part of the sub-pixels is lower than that of the hole injection layer 4 between the light-emitting material layer 3 and the first electrode 1 of other sub-pixels, so as to reduce a difference between the turn-on voltages of sub-pixels with different colors.

The number of layers included in the hole injection layer may be understood as the number of kinds of materials forming the hole injection layer, that is, one layer may be considered to be formed of a same material. That is to say, the hole injection layer between the light-emitting material layer 3 and the first electrode 1 of some sub-pixels may formed of a plurality of layers of different materials, and the hole injection layer of sub-pixels with different colors may be formed of different kinds of materials.

FIG. 1 of the present embodiment shows that the hole injection layer 4, the light-emitting material layer 3, and the second electrode 2 are sequentially disposed on the first electrode 1. The number of layers of the hole injection layer of the left sub-pixel is lower than that of the hole injection layer of the right sub-pixel. In the OLED device of the present embodiment, the number of layers of the hole injection layer between the light-emitting material layer 3 and the first electrode 1 of a part of the sub-pixels is lower than that of the hole injection layer between the light-emitting material layer 3 and the first electrode 1 of other sub-pixels. For example, the red sub-pixel includes a hole injection layer 4 formed of one kind of material, and the green sub-pixel includes a hole injection layer 4 formed of two kinds of materials. Since two layers of different materials of the hole injection layer are favorable for improving the injection efficiency of holes, the turn-on voltage of the green sub-pixel can be reduced to a certain extent, thereby reducing the difference between the turn-on voltages of the red sub-pixel and the green sub-pixel, that is, the difference between the turn-on voltages for the sub-pixels of different colors in the device is effectively reduced, thereby avoiding the undesirable phenomenon of redness at a lower gray scale.

Figure 2:
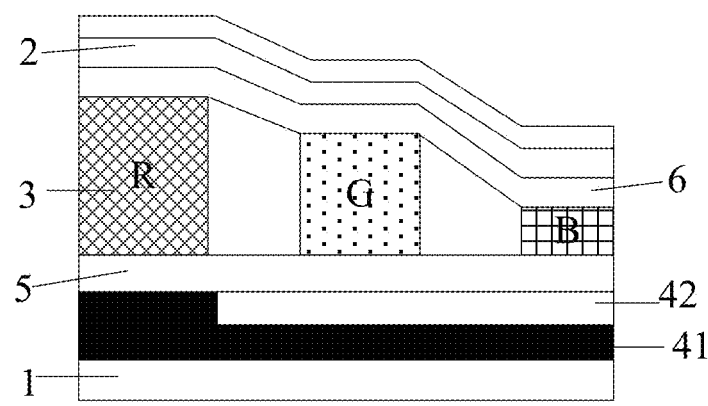
FIG. 2 is a schematic structural diagram of an OLED device according to an embodiment of the present disclosure.

As shown in FIG. 2, there is provided a OLED device including a plurality of pixels, each of the plurality of pixels including a red sub-pixel, a green sub-pixel, and a blue sub-pixel, each of the sub-pixels including a first electrode 1, a second electrode 2, and a light-emitting material layer 3 disposed between the first electrode 1 and the second electrode 2. A hole injection layer 4 is disposed between the light-emitting material layer 3 and the first electrode 1 of each of the sub-pixels, and the number of layers of the hole injection layer 4 between the light-emitting material layer 3 and the first electrode 1 of the red sub-pixel is lower than that of the hole injection layer 4 between the light-emitting material layer 3 and the first electrode 1 of the green sub-pixel and the blue sub-pixel, so as to reduce a difference between the turn-on voltages of sub-pixels with different colors.

FIG. 2 of the present embodiment shows that the hole injection layer 4, the light-emitting material layer 3, and the second electrode 2 are sequentially disposed on the first electrode 1. The first electrode 1 and the second electrode 2 are an anode and a cathode, respectively. The OLED device in FIG. 2 includes the red sub-pixel, the green sub-pixel and the blue sub-pixel. It can be understood that, the case of the cyan, yellow, and purple sub-pixels or the case of the sub-pixels with four colors may be similar to those described above, and the number of layers of the hole injection layer between the light-emitting material layer and the first electrode of a part of sub-pixels may be lower than that of the hole injection layer between the light-emitting material layer and the first electrode of other sub-pixels, so as to reduce a difference between the turn-on voltages of sub-pixels with different colors.

As an optional implementation of the embodiment, the red sub-pixel includes a single-layered hole injection layer composed of a first hole injection layer 41, and the green sub-pixel and the blue sub-pixel each include a two-layered hole injection layer composed of the first hole injection layer 41 and a second hole injection layer 42. The first hole injection layer 41 and the second hole injection layer 42 are formed of different materials.

Specifically, referring to FIG. 2, only the first hole injection layer 41 is disposed in the red sub-pixel, that is, the number of layers of the hole injection layer in the red sub-pixel is one. The first hole injection layer 41 and the second hole injection layer 42 are disposed in both the green sub-pixel and the blue sub-pixel, that is, the number of layers of the hole injection layer in the green sub-pixel and the blue sub-pixel is two. The red sub-pixel has a single-layered hole injection layer 4, and the green sub-pixel and the blue sub-pixel each have a two-layered hole injection layer 4. The hole injection layer both in the green sub-pixel and the blue sub-pixel may form a step barrier, which is advantageous for reducing hole injection. Therefore, not only the turn-on voltage of the device can be lowered, but also the light-emitting efficiency of the device can be improved. Therefore, the single-layer and two-layer combination design structure can effectively adjust the difference between the turn-on voltages between the sub-pixels emitting three colors of light in the device, thereby avoiding the occurrence of redness at a lower gray scale.

As the thickness of the hole injection layer increases, the hole injection ability first increases and then decreases. The hole injection layer having a thickness which makes the hole injection ability relatively larger is selected. In one embodiment, the second hole injection layer 42 has a thickness between about 5 nm and about 15 nm. The first hole injection layer 41 of the red sub-pixel has a thickness between about 10 nm and about 25 nm. The first hole injection layers 41 of the green sub-pixel and the blue sub-pixel both have a thickness between about 5 nm and about 10 nm.

In an embodiment, the first hole injection layer has an HOMO energy level between about 4.9V and about 5.1 V, and the second hole injection layer has an HOMO energy level between about 5.2V and about 5.3 V.

The first electrode 1 in the embodiment is formed of indium tin oxide (ITO). A hole transport layer (HTL) 5 is further disposed between the light-emitting material layer 3 and the hole injection layer 4. Since the ITO has a work function of about 4.7V and the hole transport layer 5 has an HOMO energy level of about 5.4V, the first hole injection layer 41 of the two-layered the hole injection layer 4 has an HOMO energy level of about 5.0V and the second hole injection layer 42 of the two-layered the hole injection layer 4 has an HOMO energy level of about 5.2V, such that the respective hole transport layers of the green sub-pixel and the blue sub-pixel can form a step barrier, which is advantageous for reducing hole injection.

Figure 3:
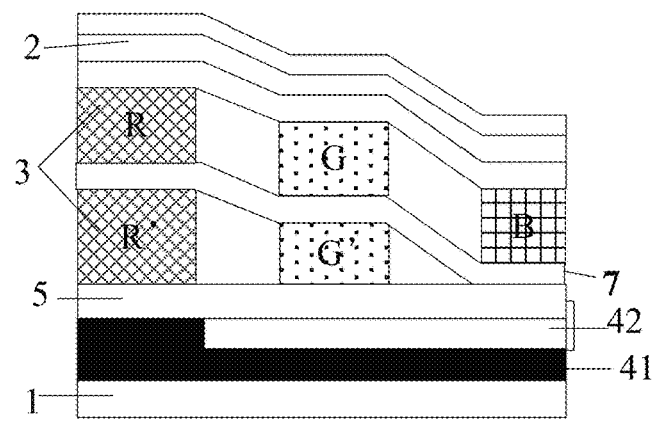
FIG. 3 is a schematic structural diagram of an OLED device according to an embodiment of the present disclosure.

According to another embodiment of the present disclosure, as shown in FIG. 3, an electron blocking layer 7 is further disposed in the light-emitting material layers of the red sub-pixel and the green sub-pixel, and an electron blocking layer 7 is further disposed between the light-emitting material layer and the hole transport layer 5 of the blue sub-pixel for blocking electrons from escaping from the light-emitting material layer and thereby causing holes from the anode to be recombined with the electrons, such that the OLED device may emit light. In addition, in a case where there is the electron blocking layer 7, the red sub-pixel includes two light-emitting material layers R, R', and the green sub-pixel also includes two light-emitting material layers G, G', wherein the light-emitting material layers R', G' play roles of adjusting a micro-cavity length of the OLED device to facilitate light emitting from the surface of the OLED device.

The effects according to the embodiments of the present disclosure will be described below by comparing the present embodiment with a comparative example.

Figure 4:
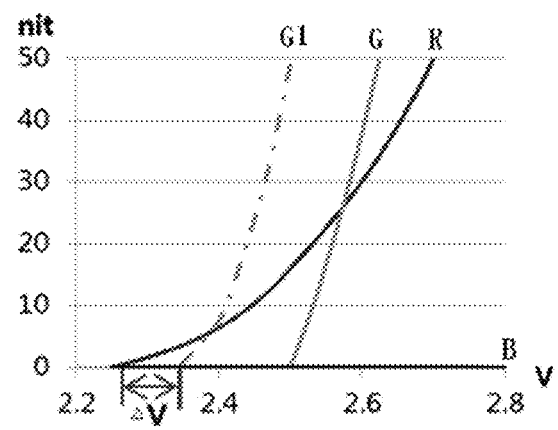
FIG. 4 is a graph of luminance of an OLED device Vs voltage according to an embodiment of the present disclosure.
Figure 5:
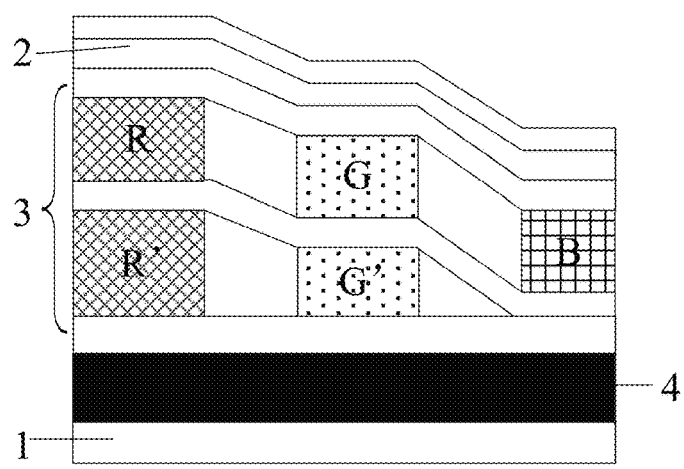
FIG. 5 is a schematic structural diagram of an OLED device in a comparative example.
Figure 6:
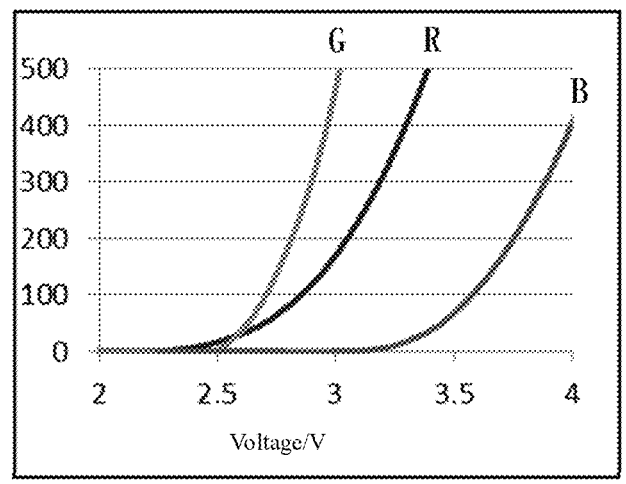
FIGS. 6 and 7 are graphs of luminance of an OLED device Vs voltage in comparative examples.
Figure 7:
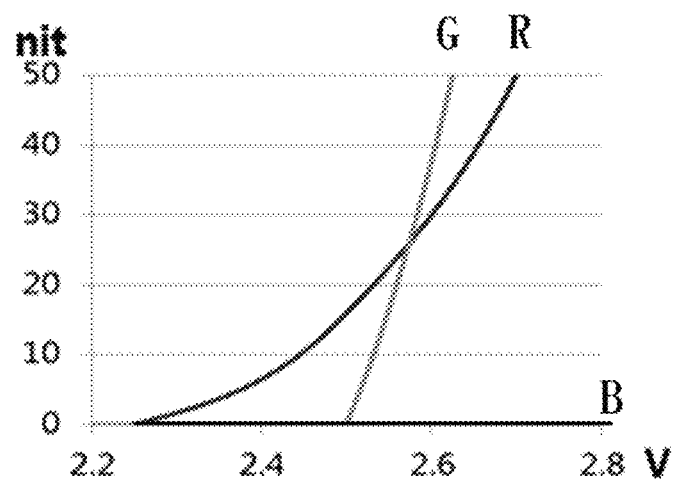

The schematic diagram of a structure of an OLED device of the comparative example is shown in FIG. 5, the red sub-pixel, the green sub-pixel, and the blue sub-pixel each include a single-layered hole injection layer 4, and the graphs showing luminance of an OLED device when emitting light as the voltage changes in a comparative example are shown in FIG. 6 and FIG. 7. A curve marked as G represents the luminance of the green sub-pixel when emitting light as the voltage changes, a curve marked as R represents the luminance of the red sub-pixel when emitting light as the voltage changes, and a curve marked as B represents the luminance of the blue sub-pixel when emitting light as the voltage changes. FIG. 7 is an enlarged diagram of a part of FIG. 6. As shown in FIG. 7, the red sub-pixel has a turn-on voltage between about 2.2V and about 2.4V, and the green sub-pixel has a turn-on voltage between about 2.4V and about 2.6V. A graph showing the luminance of the OLED device when emitting light as the voltage changes in the present embodiment compared with the comparative example is shown in FIG. 4. A curve marked as G of FIG. 4 represents the luminance of the green sub-pixel when emitting light in the comparative example, and a curve marked as G1 of FIG. 4 represents the luminance of the green sub-pixel when emitting light in the present embodiment. It can be seen that the turn-on voltage of the green sub-pixel in the present embodiment is between about 2.2V and about 2.4V. As can be seen from FIG. 4, the different between the turn-on voltages ($\Delta V$ in FIG. 4) of the green sub-pixel and the red sub-pixel in the present embodiment is much smaller than that of the turn-on voltages of the green sub-pixel and the red sub-pixel in the comparative example.

Figure 8:
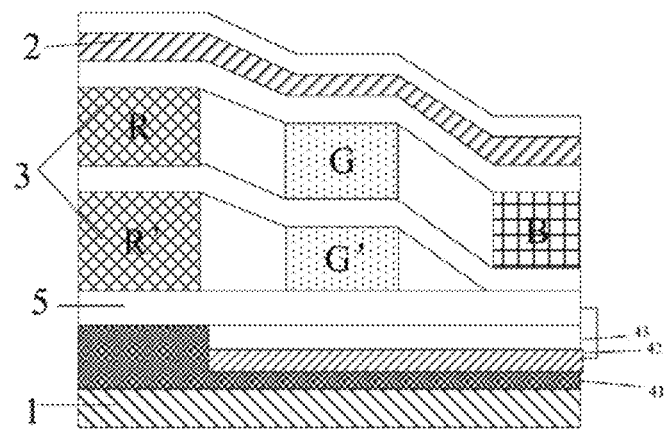
FIG. 8 is a schematic structural diagram of an OLED device according to an embodiment of the present disclosure.

Optionally, according to an embodiment of the present disclosure, the thickness and the material of the hole injection layer may be changed such that the turn-on voltage of the red sub-pixel is equal to the turn-on voltage of the green sub-pixel, that is, $\Delta V$ in FIG. 4 is zero. In addition, the number of layers of the hole injection layer of the green sub-pixel and the blue sub-pixel may be changed. For example, as shown in FIG. 8, the green sub-pixel and the blue sub-pixel each include three hole injection layers 41-43, which are formed of different materials, such that the HOMO energy levels of the hole injection layers 41-43 are sequentially increased, and are higher than 4.7 V and lower than 5.4 V, such that the hole injection layers of the green sub-pixel and the blue sub-pixel form a step barrier, which is advantageous for reducing hole injection. Therefore, not only the turn-on voltage of the device can be lowered, but also the light-emitting efficiency of the device can be improved.

Figure 9:
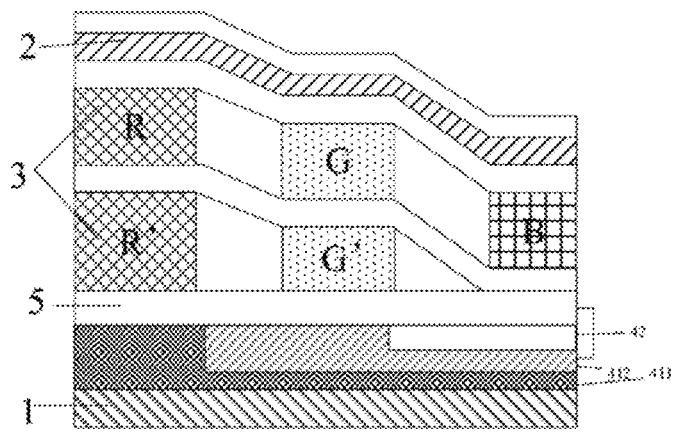
FIG. 9 is schematic structural diagram of an OLED device according to an embodiments of the present disclosure.

Optionally, as shown in FIG. 9, the number of layers of the hole injection layer in the green sub-pixel and the blue green sub-pixel may be changed, such that the green sub-pixel includes two hole injection layers 411 and 412 and the blue sub-pixel includes three hole injection layers 411, 412 and 42. The hole injection layers 411, 412 and 42 are formed of different materials, such that the HOMO energy levels of the hole injection layers 411, 412 and 42 are sequentially increased, and are higher than 4.7 V and lower than 5.4 V. As such, the difference between the turn-on voltages of the red sub-pixel, the green sub-pixel and the blue sub-pixel can be further reduced.

According to an embodiment of the present disclosure, the number of layers of the hole injection layer of the red sub-pixel, the green sub-pixel, and the blue sub-pixel and the HOMO energy level of each of the hole injection layers may be appropriately selected such that the red sub-pixel, the green sub-pixel and the blue sub-pixel have a same turn-on voltage.

The size, thickness, and the like of each structural layer shown in the figures are merely illustrative. In the process implementation, the projected area of each structural layer on the substrate may be the same or different; at the same time, the structure shown in the figures does not be limited by the geometric shape of each structural layer. For example, the structural layer may have a rectangle shape as shown in the figures, or may have a trapezoidal shape or other shape formed by etching.

In the OLED device of the present disclosure, the number of layers of the hole injection layer between the light-emitting material layer and the first electrode of a part of the sub-pixels is lower than that of the hole injection layer between the light-emitting material layer and the first electrode of other sub-pixels. As such, not only the turn-on voltage of the device can be lowered, but also the light-emitting efficiency of the device can be improved, which is equivalent to effectively reducing the difference between the turn-on voltages of the sub-pixels emitting light of different colors in the device, thereby avoiding the phenomenon of redness at a lower gray scale. The OLED device of the present disclosure is applicable to various display apparatus.

Figure 10:
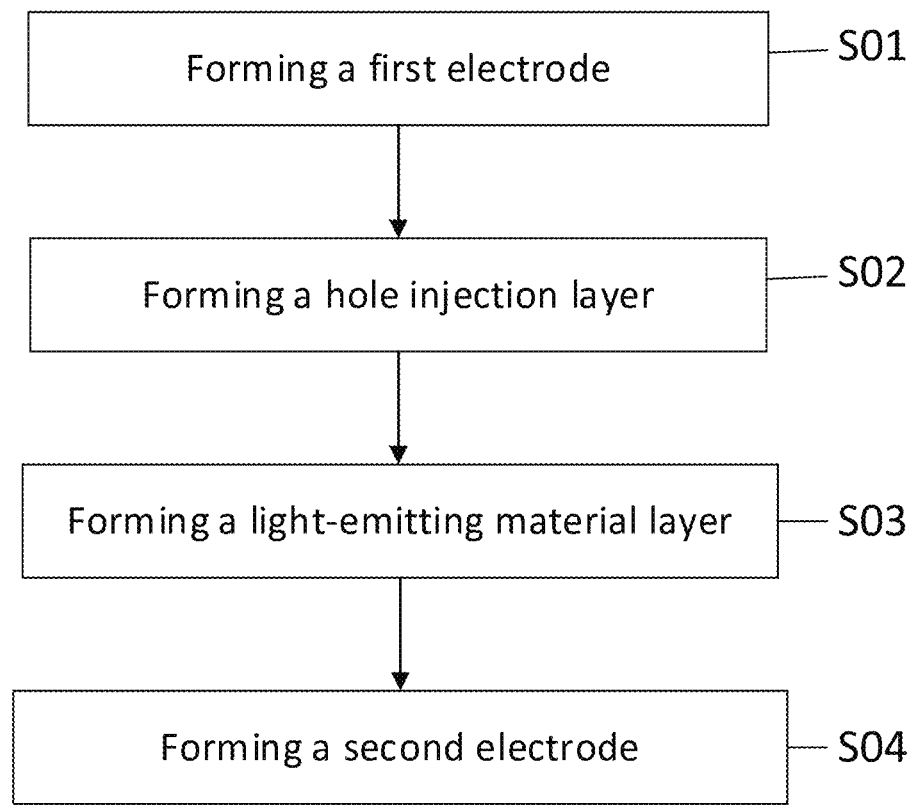
FIG. 10 is a flow chart illustrating a manufacturing method of an OLED device according to an embodiment of the present disclosure.

As shown in FIG. 10, there is provided a manufacturing method of the OLED device, such as shown in FIG. 2, including the following steps S01 to S04.

At the step S01, an anode conductive film is formed on a substrate by sputtering, and a patterning process is performed on the anode conductive film to form a pattern including an anode (i.e., a first electrode). The anode is generally made of an inorganic metal oxide (such as indium tin oxide (ITO), zinc oxide (ZnO) and so on), an organic conductive polymer (such as poly 3,4-ethylenedioxythio-phene/polystyrene sulfonate (PEDOT:PSS), polyaniline (PAM), and so on), or a metal material with high work function (such as gold, copper, silver, platinum, etc.). The thickness of the anode ranges from about 10 to about 200 nm.

At the step S02, a hole injection layer 4 is formed. The number of layers of the hole injection layer 4 between the light-emitting material layer 3 and the first electrode 1 of a part of the sub-pixels is lower than that of the hole injection layer 4 between the light-emitting material layer 3 and the first electrode 1 of other sub-pixels, so as to reduce the difference between the turn-on voltages of the sub-pixels with different colors.

Specifically, the plurality of the sub-pixels with different colors include a red sub-pixel, a green sub-pixel and a blue sub-pixel, and the hole injection layer 4 is formed by the following steps S02*a* to S02*c*.

At the step S02*a*, a first hole injection layer 41 is formed on each of the sub-pixels with a line evaporation source;

At the step S02*b*, the green sub-pixel and the blue sub-pixel are blocked and a further layer of a material of the first hole injection layer 41 is only formed on the red sub-pixel with a line evaporation source by a fine metal mask.

At the step S02*c*, the red sub-pixel is blocked and a second hole injection layer 42 is only formed on the green sub-pixel and the blue sub-pixel.

The material of the hole injection layer 4 includes an organic material doped with phosphorescent dopant (P), such as any one of 2,3,6,7,10,11-hexacyano-1,4,5,8,9, 12-hexaazabenzophenanthrene (HAT-CN), 2,3,5,6-tetra-fluoro-7,7',8,8'-tetracyanodimethyl-p-benzene ($F_4$-TCNQ), three (4-bromophenyl)ammonium hexachloroantimonate (TBAHA). Further, the HOMO energy level of the first hole injection layer 41 is between about 4.9 and about 5.1 V, and the HOMO energy level of the second hole injection layer 42 is between about 5.2 and about 5.3 V.

The step of forming the hole injection layer is not limited thereto, and is depended on the number of the layers of the hole injection layer included in the red sub-pixel, the green sub-pixel and the blue sub-pixel.

For example, in a case of preparing the OLED device as shown in FIG. 8, the step of forming the hole injection layer may include:

forming a first hole injection layer on each of the sub-pixels;

then only forming a layer of material of the first hole injection layer on the red sub-pixel by blocking the green sub-pixel and the blue sub-pixel; and then only forming a second hole injection layer and a third hole injection layer sequentially on both the green sub-pixel and the blue sub-pixel by blocking the red sub-pixel.

In addition, in a case of preparing the OLED device as shown in FIG. 9, the step of forming the hole injection layer may include:

forming a first hole injection layer on each of the sub-pixels;

then only forming a layer of material of the first hole injection layer on the red sub-pixel by blocking the green sub-pixel and the blue sub-pixel;

then only forming a second hole injection layer on both the green sub-pixel and the blue sub-pixel by blocking the red sub-pixel;

then only forming a further layer of material of the second hole injection layer on the green sub-pixel by blocking the red sub-pixel and the blue sub-pixel; and then only forming a third hole injection layer on the blue sub-pixel by blocking the red sub-pixel and the green sub-pixel.

Optionally, the method may further include a step S02d of forming the hole transport layer 5. The hole transport layer 5 may include a material having a hole transport rate greater than $10^{-5}$ cm$^2$V.S, which may be an aromatic diamine compound, a triphenylamine compound, an aromatic triamine compound, a biphenyldiamine derivative, a triarylamine polymer, a metal complex, or a carbazole polymer.

At the step S03, a light-emitting material layer 3 is formed. The light-emitting material layer 3 may be made of an undoped fluorescent luminescent organic material, an organic material doped with a fluorescent material composed of a fluorescent dopant and a matrix material, or an organic material doped with a phosphor material composed of a phosphor dopant and a matrix material. The thickness of the light-emitting material layer 3 ranges from about 10 nm to about 50 nm.

Optionally, the method may further include a step S03a of forming an electron transport layer 6, the material of which has a high electron mobility, such as any one of 2-(4-biphenyl)-5-phenyl diazole (PBD), 2,5-bis(1-naphthyl)-1,3,5-oxadiazole (BND), 2,4,6-triphenyloxy-1,3,5-triazine (TRZ). The thickness of the electron transport layer 6 ranges from about 10 nm to about 30 nm.

At the step S04, a cathode (i.e., a second electrode) is formed by a vacuum evaporation process. The cathode is generally made of a metal material with a low work function, such as lithium, magnesium, calcium, barium, aluminum, indium, made of an alloy made of the above metals with copper, gold, silver, or made of a thin buffer insulation layer (such as lithium fluorination (LiF), cesium carbonate (CsCO$_3$)) with the above metal material or alloy. The thickness of the cathode ranges from about 10 to about 20 nm.

Obviously, the specific implementation of the above embodiments may also be varied. For example, the material of each functional layer may be selected as needed, and the thickness of the functional layer may be adjusted according to an actual situation.

The present embodiment also provides a display apparatus including any one of the above OLED devices. The display apparatus may be any product or component having a display function, such as an electronic paper, an OLED panel, a mobile phone, a tablet computer, a television, a display, a notebook computer, a digital photo frame, a navigator, and the like.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. An OLED device, comprising a plurality of pixels, each of the plurality of pixels comprising a plurality of sub-pixels with different colors, each of the plurality of sub-pixels comprising a first electrode, a second electrode, and a light-emitting material layer disposed between the first electrode and the second electrode, wherein a hole injection layer is disposed between the light-emitting material layer and the first electrode of each of the sub-pixels, and a number of layers of the hole injection layer between the light-emitting material layer and the first electrode of a part of the sub-pixels is lower than that of other sub-pixels, wherein the plurality of sub-pixels with different colors comprise a red sub-pixel, a green sub-pixel, and a blue sub-pixel, and the number of layers of the hole injection layer between the light-emitting material layer and the first electrode of the red sub-pixel is lower than those of the green sub-pixel and the blue sub-pixel, wherein the hole injection layer of the red sub-pixel is a single-layered hole injection layer composed of a first hole injection layer, and the hole injection layers of the green sub-pixel and the blue sub-pixel each are a two-layered hole injection layer composed of the first hole injection layer and a second hole injection layer, and wherein the first hole injection layer and the second hole injection layer are formed of different materials, respectively, such that the first hole injection layer has a HOMO energy level lower than that of the second hole injection layer.

2. The OLED device according to claim 1, wherein the first electrode is formed of an ITO material having a work function of about 4.7V.

3. The OLED device according to claim 2, further comprising a hole transport layer between the light-emitting material layer and the hole injection layer, wherein the hole transport layer has a HOMO energy level of about 5.4V.

4. The OLED device according to claim 3, further comprising an electron blocking layer disposed in the light-emitting material layers of the red sub-pixel and the green sub-pixel, and an electron blocking layer disposed between the light-emitting material layer and the hole transport layer of the blue sub-pixel.

5. The OLED device according to claim 1, wherein the second hole injection layer has a thickness between about 5 nm and about 15 nm.

6. The OLED device according to claim 5, wherein the first hole injection layer of the red sub-pixel has a thickness between about 10 nm and about 25 nm, and the first hole injection layers of the green sub-pixel and the blue sub-pixel each have a thickness between about 5 nm and about 10 nm.

7. The OLED device according to claim 1, wherein the first hole injection layer has a HOMO energy level between about 4.9V and about 5.1V, and the second hole injection layer has a HOMO energy level between about 5.2V and about 5.3V.

8. The OLED device according to claim 1, wherein each of the green sub-pixel and the blue sub-pixel further comprises a third hole injection layer.

9. The OLED device according to claim 8, wherein the first hole injection layer, the second hole injection layer, and the third hole injection layer are formed of different materials, respectively, such that HOMO energy levels of the first hole injection layer, the second hole injection layer, and the third hole injection layer are sequentially increased, and are higher than about 4.7V but lower than about 5.4V.

10. The OLED device according to claim 1, wherein the blue sub-pixel further comprises a third hole injection layer.

11. The OLED device according to claim 10, wherein the first hole injection layer, the second hole injection layer, and the third hole injection layer are formed of different materials, respectively, such that HOMO energy levels of the first hole injection layer, the second hole injection layer, and the third hole injection layer are sequentially increased, and are higher than about 4.7V but lower than about 5.4V.

12. The OLED device according to claim 1, wherein the red sub-pixel, the green sub-pixel, and the blue sub-pixel have a same turn-on voltage.

13. A display apparatus, comprising the OLED device of claim 1.

14. A manufacturing method of an OLED device comprising a plurality of pixels, each of the plurality of pixels comprising a plurality of sub-pixels with different colors, each of the plurality of sub-pixels comprising a first electrode, a second electrode, and a light-emitting material layer disposed between the first electrode and the second electrode, the method comprising steps of:
   forming the first electrode;
   forming a hole injection layer such that a number of layers of the hole injection layer between the light-emitting material layer and the first electrode of a part of the sub-pixels is lower than that of other sub-pixels;
   forming a light-emitting material layer; and
   forming the second electrode,
   wherein the plurality of sub-pixels with different colors comprise a red sub-pixel, a green sub-pixel, and a blue sub-pixel, and the number of layers of the hole injection layer between the light-emitting material layer and the first electrode of the red sub-pixel is lower than those of the green sub-pixel and the blue sub-pixel,
   wherein the hole injection layer of the red sub-pixel is a single-layered hole injection layer composed of a first hole injection layer, and the hole injection layers of the green sub-pixel and the blue sub-pixel each are a two-layered hole injection layer comprised of the first hole injection layer and a second hole injection layer,
   wherein the first hole injection layer and the second hole injection layer are formed of different materials, respectively, such that the first hole injection layer has a HOMO energy level lower than that of the second hole injection layer.

15. The manufacturing method of an OLED device according to claim 14, wherein
   the step of forming a hole injection layer comprises steps of:
   forming a first hole injection layer on each of the sub-pixels;
   then only forming a further layer of material of the first hole injection layer on the red sub-pixel by blocking the green sub-pixel and the blue sub-pixel; and
   then forming a second hole injection layer on the green sub-pixel and the blue sub-pixel by blocking the red sub-pixel.

16. The manufacturing method of an OLED device according to claim 15, wherein the step of forming a hole injection layer further comprises:
   forming a third hole injection layer both on the green sub-pixel and the blue sub-pixel by blocking the red sub-pixel.

17. The manufacturing method of an OLED device according to claim 15, wherein the step of forming a hole injection layer further comprises steps of:
   only forming a further layer of material of the second hole injection layer on the green sub-pixel by blocking the red sub-pixel and the blue sub-pixel; and
   then only forming a third hole injection layer on the blue sub-pixel by blocking the red sub-pixel and the green sub-pixel.

* * * * *